United States Patent [19]

Deutsch et al.

[11] 4,340,617
[45] Jul. 20, 1982

[54] METHOD AND APPARATUS FOR DEPOSITING A MATERIAL ON A SURFACE

[75] Inventors: Thomas F. Deutsch, Cambridge; Daniel J. Ehrlich, Arlington; Richard M. Osgood, Winchester, all of Mass.

[73] Assignee: Massachusetts Institute of Technology, Cambridge, Mass.

[21] Appl. No.: 150,816

[22] Filed: May 19, 1980

[51] Int. Cl.$^3$ .............................................. C23C 13/00
[52] U.S. Cl. .................................. 427/53.1; 118/50.1; 204/157.1 H
[58] Field of Search .............. 427/53.1; 204/DIG. 11, 204/157.1 L; 219/121 L, 121 LM; 118/50.1

[56] References Cited

U.S. PATENT DOCUMENTS

| | | | |
|---|---|---|---|
| 3,620,814 | 11/1971 | Clark et al. | 427/53.1 |
| 3,957,474 | 5/1976 | Kobayashi et al. | 427/53.1 |
| 4,042,006 | 8/1977 | Engl et al. | 427/53.1 |
| 4,260,649 | 4/1981 | Dension et al. | 427/53.1 |

OTHER PUBLICATIONS

Hanabusa et al., "App. Phys. Lett.", 35 (8), pp. 626–627, Oct. 1979.
Cali et al., "Applied Optics", vol. 15, No. 5, pp. 1327–1330, May 1976.

*Primary Examiner*—John H. Newsome
*Attorney, Agent, or Firm*—Arthur A. Smith, Jr.; Gary Walpert

[57] ABSTRACT

An apparatus and method for depositing a layer of a surface-compatible material from the fluid phase onto a selected surface of a substrate body in a fluid deposition chamber features a laser source of optically focused energy directed toward the body surface in a selected pattern. The energy is focused at a position adjacent the selected surface. Apparatus is provided for introducing a fluid medium adjacent the surface of the body. The medium has at least one component which absorbs a portion of the incident laser energy at the selected frequency for effecting photodecomposition or photolysis of the component in the fluid phase. Thereby, the product(s) of the photolysis process are deposited in the selected pattern on the substrate surface. The pattern may be fixed in position or may be optically or mechanically scanned across the substrate body. Thereby, metal layers, metal interconnects, pn junction and ohmic contact forming layers, selectively doped regions, etc. can be accurately deposited on the substrate surface, and in particular semiconductor substrate surfaces without the use of masks.

53 Claims, 3 Drawing Figures

METHOD AND APPARATUS FOR DEPOSITING A MATERIAL ON A SURFACE

The Government has rights in this invention pursuant to Contract No. F19(628)-78-C-0002 awarded by the Department of the Air Force.

The invention relates generally to a method and apparatus for depositing material from a fluid phase onto a substrate surface and in particular to the use of laser initiated photodissociation in the fluid phase for effecting deposition of selected surface-compatible material products of the fluid phase reactions on a substrate surface in a selected pattern.

BACKGROUND OF THE INVENTION

The deposition of materials from a gaseous phase onto a substrate, and in particular onto a semiconductor substrate, is well known. One class of well known deposition techniques employs photolithographically produced masks for generating patterned deposits for use in fabricating an integrated semiconductor device. These techniques require multistep processing on a microscopic level. Typically, these techniques provide a resolution which is limited by the resolution of the masks, the control and registration by which the masks can be positioned (and repositioned) during the manufacturing process, and the subsequent etching and deposition techniques. Thus while the masks themselves are usually generated optically and have a high spatial resolution, the spatial resolution of the final product is limited by the ability to register the mask, control the optical mask making process, and control the etching and deposition procedures employed therewith. In addition, the masks themselves have inherent defects (such as pin holes, "mousenips", and other (faults) which must be corrected.

Other methods for forming thin film structures by deposition from the gaseous phase without the use of masks are also well known. Thus conventional chemical vapor deposition, a maskless process, relies on the use of a heated substrate to produce localized pyrolysis of one or more of the carrier gases with the subsequent formation of, for example, a semiconductor film on the substrate. This process is clearly disadvantageous at least because the heated substrate and film, when cooled, generate stresses which can seriously affect the electrical and mechanical properties of the device. These stresses result from a generally different coefficient of expansion for the deposit when compared to the substrate. In addition, conventional chemical vapor deposition processes are not used for producing small structures.

Others have recognized the need for producing controlled deposits on a substrate, and in particular on a semiconductor substrate surface; and they have employed photolytic processes for fabricating thin film patterns. Thus, for example, White U.S. Pat. No. 3,271,180, describes a method for forming a thin film of material in a geometric pattern upon a rigid substrate by introducing, into a chamber containing the substrate, a vapor of material to be deposited and then controlling the pressure of the vapor to form an adsorbed layer of the material on the substrate surface. Only the adsorbed layer is then photolytically reacted by incident light of a first predetermined wavelength. (The vapor is capable of being photolytically reacted in the gas phase only by incident light of a second predetermined wavelength, whereas the first (absorbed layer reacting) wavelength is greater than the reaction wavelength of the vapor (the second wavelength) in the gas phase.) Thus according to White it is only the vapor which has been adsorbed, i.e. the layer in the surface, which is reacted to provide the desired deposit on the substrate surface. White employs an incoherent light source and is limited in brightness and resolution by the losses due to optical focusing (which controls the resolution of the deposit) and the losses due to the filtering requirements to obtain a substantially monochromatic incident light at the first predetermined wavelength (resulting in reduced brightness). The filtering requirement reduces the incident light brightness so that direct writing of one micrometer lines, at practical rates, cannot be obtained.

Other workers in this field have employed photolytic decomposition on, for example, silicon dioxide by exposing the surface to a condensable vapor, cooling the surface to a temperature below the dew point of the vapor to form a thin liquid film thereon, and exposing at least a portion of the interface between the liquid film and the surface to an activating radiation to cause formation of a surface-imcompatible specie for etching the silicon dioxide surface in the illuminated areas. This is described for example by Schaefer, U.S. Pat. No. 3,494,768. This method thus employs a decomposable liquid on a solid surface and the disclosed sources, like White above, are incoherent sources, for example high pressure mercury lamps.

Other workers in the semiconductor field recognized the need for developing alternate methods of depositing surface-incompatible materials, etchants, from the gas phase onto a semiconductor surface. Thus, Hall, U.S. Pat. No. 2,841,477, describes a relatively broad area method for etching metals and semiconductors by using photochemically activated gases to generate surface-incompatible compositions in the gas phase. Hall introduces an otherwise chemically inactive photolyzable gas (or gases) into a chamber in which the surface of, for example, a semiconductor crystal is exposed. When exposed to his incoherent ultraviolet radiation, which need not be focused, the initially inactive gas produces free radicals which are capable of depositing upon and etching the specimen semiconductor crystal surface. Hall discloses several alternate methods for masking or "concentrating" the incoherent incident light upon the specimen to be etched. In one particular embodiment, Hall employs a convex lens to focus the incident incoherent light substantially upon the semiconductor surface to effect formation of a pit, and in other embodiments he uses "light" shields to selectively block portions of the incident radiation and thereby selectively etch portions of the semiconductor surface. In all embodiments, photodecomposition can take place whenever the incoherent ultraviolet radiation is present in the chamber, that is, whether the incident energy is focused or not, close to or distant from the substrate surface.

It is therefore an object of the present invention to provide an improved method and apparatus for producing, without the use of masks, a thin film in a selected pattern on a substrate surface. Other objects of the invention are providing high resolution, providing a more controlled, yet high deposition rate, composition, and structure in a maskless environment, minimizing unwanted diffusion of material within the substrate during processing, having a minimum cost, and resulting in a reliable manufacturing process and product. Yet further objects of the invention are an apparatus and method which can be employed with a complex substrate in a dry state and which operates at low temperatures. A yet further object is to provide a maskless apparatus and method having a sufficiently rapid direct writing rate to effect practical writing of one micrometer size features.

SUMMARY OF THE INVENTION

The invention relates to an apparatus and method for depositing a layer of a surface-compatible material from a fluid phase onto a selected surface of a body in a fluid deposition chamber. A jig is provided for supporting the body in the chamber. The apparatus features a laser source of electromagnetic energy operating at a desired frequency and an optical system for focusing the energy toward the selected surface, in a selected pattern, and at a position adjacent to the selected surface. Apparatus is provided for introducing a fluid medium into the chamber adjacent the surface of the body and at least one component of the fluid medium absorbs a portion of the incident laser energy at the selected frequency for effecting photodecomposition or photolysis of the component in the medium and in the fluid phase for depositing the material onto the surface. The optical system provides a desired pattern of the laser source at the focused position and the pattern may be a substantial point pattern, a pattern generated through an interference optical system, or any other desired optically generated pattern.

The invention, in one aspect, relates to an apparatus and method for depositing a layer of a surface-compatible material from the gaseous phase onto a selected surface of a body in a gas deposition chamber. A jig is provided for supporting the body. The apparatus features a laser source of energy operating at a desired frequency and an optical system for focusing the energy toward the selected surface and at a position adjacent the selected surface. Apapratus is provided for introducing a gaseous medium into the chamber adjacent to the surface of the body and at least one component of the gaseous medium absorbs a portion of the incident laser energy at the selected frequency for effecting photodecomposition or photolysis of the component of the medium in the gaseous phase close to the surface, for depositing the material upon the surface.

In a particular embodiment of the invention, there is further provided a system for scanning the focused laser energy across the surface of the substrate for depositing the layer according to a predetermined spatial pattern. Preferably, the laser operates in the ultraviolet range and can be for example a frequency doubled argon-ion laser operating at 257 nm.

In another aspect of the invention, the apparatus and method relate to repairing a discontinuity in a pre-existing surface feature of a body by photodepositing a selected material from the gaseous phase onto the body surface layer. This apparatus features the deposition chamber, the jig for supporting the body in the chamber, the laser source, the optical system, and the gas introduction system described in connection with the previous embodiment whereby, for example, a metallic layer can be deposited from the gas phase for connecting a discontinuity in, for example, a conductor lead line or a photolithographic mask.

In yet another aspect of the invention, apparatus including the deposition chamber, the jig, the laser source, the optical system, and the gas introduction system described above are employed in operative combination with a heating element for providing a selectively doped region on a semiconductor substrate surface. Typical examples are the formation of ohmic contacts on or pn junctions in a semiconductor substrate. The heating element features an assembly for locally heating the substrate for producing a doped surface area; and well localized heating can be obtained using, for example, the laser source.

As noted above, in this aspect of the invention, the apparatus can produce a pn junction on a semiconductor substrate. This apparatus employs the deposition chamber, the support jig, the laser source, the optical system, and the gas introduction system described above and provides subsequent to or simultaneous with the photodecomposition, elements for locally heating the substrate for urging diffusion of a deposited coating to form the pn junction. (A single laser can both heat and deposit.) In this instance the deposited coating could be for example aluminum. In one particularly preferred embodiment, local heating of the substrate can be accomplished by focusing a separate laser source onto the substrate so that its laser energy is absorbed by the substrate surface. The extent of heating can be adjusted by varying the intensity or the wavelength of the heating laser source.

In each of the methods and apparatus described above, there can further be featured a gas supply assembly (which may be part of the original gas introduction system) for establishing a buffer gas component (preferably an inert, rare gas) in the gaseous medium for improving localization of the deposited layer. This can provide increased spatial resolution and an altered deposition rate. In another aspect, a scavenger gas component can be introduced into the gaseous medium for removing unwanted products of the gaseous photodecomposition or photolysis. In yet another aspect of the invention, an additional gas component, not necessarily subject to photodecomposition, can be added to react, in the gas phase, with the photolysis product to produce a desired deposit on the substrate surface.

BRIEF DESCRIPTION OF THE DRAWINGS

Other objects, features, and advantages of the invention will become apparent from the following description of particular embodiments of the invention taken together with the drawings in which.

DESCRIPTION OF PARTICULAR EMBODIMENTS

The invention pertains to the deposition of a layer of surface-compatible material from the fluid phase onto a selected substrate surface. The fluid may be either a liquid or gas mixture so long as it is substantially transparent to the incident energy. In the embodiments which follow however, only the gaseous phase apparatus and method will be described, it being obvious that the liquid phase reactions are analogous thereto.

Figure 1:
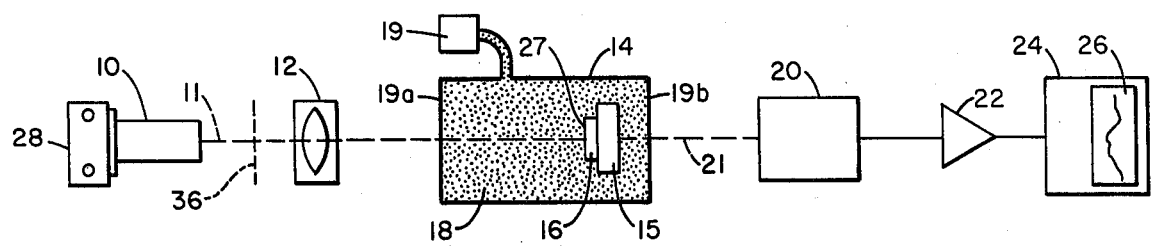
FIG. 1 is a schematic representation of a first embodiment according to the invention.

Referring now to FIG. 1, a first particular apparatus for depositing a surface-compatible material from the gaseous phase, in a predetermined pattern, on a substrate surface, has a laser source 10 operated to produce a beam 11 of energy at a desired frequency, preferably in the ultraviolet frequency band. The beam is directed through an optical system 12 toward a chamber or cell 14 which has supported therein, by a support assembly or jig 15, a substrate body 16. The illustrated cell or chamber 14 further contains a gaseous mixture 18, supplied through a gas supply assembly 19. The gaseous mixture composition is selected to have at least one component which, in the gas phase, absorbs energy at the frequency of the incoming coherent laser produced radiation to produce a laser induced photodecomposition of that component of the gaseous mixture 18. The gaseous component can be selected, for example, from the group of organo-metallic compounds such as trimethyl aluminum or dimethyl cadmium for the deposition of aluminum or cadmium respectively. In this example, aluminum and cadmium would be one of the products of the photodecomposition process. Other gaseous compositions and elements which have been successfully employed in connection with the invention are, for example, metal carbonyls, metal halides, gaseous germanium compounds, etc.

The disassociation of the selected gaseous component is substantially linear with the intensity of laser generated radiation incident thereon. This provides a particularly advantageous control of the deposition process. It is important to note however that this linear relationship does not occur with incident radiation at all frequencies. A particularly advantageous band of frequencies with which the linear range is obtained is in the ultraviolet range. To the contrary, when the incident radiation is in the infrared range, the process generally requires non-linear optical dissociation and results, possibly, in damage to the substrate. Such heating, if not controlled by the process equipment, can produce undesirable results.

In the illustrated embodiment of the invention, the chamber 14 is a closed tubular member having a stainless steel body for defining a volume enclosed by end walls 19a, 19b. The illustrated end walls 19a, 19b are selected to be transparent to the laser supplied energy, and in many applications, the substrate body 16 can be selected so that it is also transparent to and passes the energy incident thereon. Under these circumstances, incident laser radiation can pass through chamber 14, except as attenuated for example, by the gas, the layer deposited on substrate body 16, and the substrate body itself; and the exiting energy can be monitored by a photodetecting element 20. The photodetecting element 20, which can be inside the chamber 14 or outside as illustrated, intercepts the beam 21 exiting the chamber. The photodetecting element 20 has an electrical output signal which is received by an amplifier 22 and the amplifier 22 provides an output to a visual display device, in this embodiment, a chart recorder 24. The illustrated recorder 24 provides a visual record 26 of the signal output from the photodetector. Thus, as the deposited layer builds up (in thickness), and the intensity of the beam intercepted by the photodetector correspondingly decreases, the record 26 provides an immediate visual record of the physical process.

Figure 2:
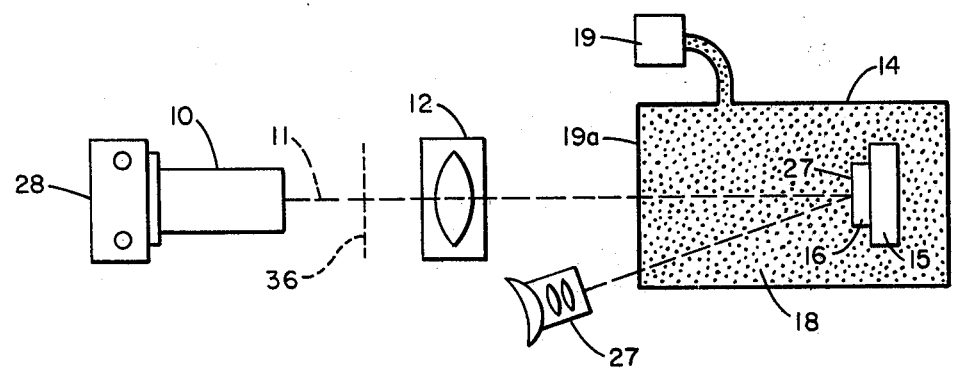
FIG. 2 is a schematic representation of a second embodiment according to the invention.

Referring to FIG. 2, in another embodiment of the invention, for example when repairing a mask or where the substrate is opaque, it is desirable to use a microscope optics 27 to observe directly the results of the photolysis process.

In yet other embodiments of the invention, it will be desirable to deposit upon the blind or back surface of a substrate, i.e. that surface from which the dissociating beam exits the substrate. Under these circumstances (which can occur for example if the fluid is highly absorptive), the substrate must be either transparent or at least semi-transparent, to the dissociating laser energy. The substrate can be independently supported as in FIG. 1, or can be either attached to for example the front window or wall of the cell, or incorporated into the front window of the cell. (On the other hand, it may be desirable to reduce or eliminate the deposition of material on the front entrance window of the cell while a substrate is being coated. Techniques for maintaining a clean front window are described in more detail below.)

Thus far the substrate has been illustrated as a relatively smooth planar surface oriented in a plane normal to the entering incident radiation. In other embodiments of the invention, the substrate can have a nonplanar surface and in one particular application of the invention the substrate can be a hollow body where it is desired to coat the substantially enclosed interior surface. Thus, for example, the surface to be coated may be the interior of a small light bulb. In this circumstance, the laser energy irradiates the interior of the light bulb and a small entrance hole is provided for the component gases to enter the interior of the body.

The choice of laser source depends upon the specific gaseous mixture, and in particular, the decomposable component(s), being employed. The laser frequency of operation, and in many cases this will dictate the laser source employed, is chosen to effect photodeposition of the decomposable molecules. Decomposition is accomplished when a molecule of the specific component absorbs a photon, from the incident laser beam, of sufficient energy to break one or more of the molecular bonds holding the component molecule together. The decomposition process can also result from a sequence of single photon absorptions.

Trimethyl aluminum and dimethyl cadmium, for example, have measurable absorptions at wavelengths less than 260 nm at pressures on the order of 1 Torr. Thus, in the illustrated embodiment, laser source 10 can be a continuous wave argon-ion laser operating at 514.5 nm which is frequency doubled in an ADP crystal. Residual green light is removed by passing the beam from the crystal through a prism and the resulting 257.2 nm radiation is focused by optical system 12 adjacent the substrate surface 27 in chamber 14. Illustrated chamber 14 can be a 3.2 centimeter long stainless steel cell having quartz entrance and exit windows. The focusing lens in the illustrated embodiment can have a seven centimeter focal length.

In a typical operating embodiment (FIG. 1) using the frequency doubled, argon-ion laser, the output power from the crystal was approximately $2 \times 10^{-4}$ watts. The cell was pumped to a pressure of less than $10^{-5}$ Torr. The chamber 14 was filled with either dimethyl cadmium or trimethyl aluminum buffered with 750 Torr helium. The focus of the lens was positioned just before the substrate body. The optical focus was located by translating the lens along the beam direction and noting the position at which the transmitted signal, intercepted and detected by the photodetector, dropped most rapidly.

As an alternate source of energy, a pulsed argon-fluoride (ArF) excimer laser which produces nominally 7-10 nsec. long pulses at 193 nm can be employed to effect decomposition of, for example, either trimethyl aluminum or dimethyl cadmium.

In the illustrated embodiment of FIG. 1, the radiation from the laser source 10 passes through the front entrance window and is incident upon the substrate surface 27. To prevent deposition of material on the entrance window, a condition which is not desirable since such deposition reduces the available energy within the chamber, one of several approaches can be employed. First, the front or entrance window of the chamber can be coated with a material or materials having a low sticking coefficient with respect to the deposition atoms. Thus, the atoms will not condense on the front window. Second, the front window can be heated to encourage reevaporation of the condensing material. Third, a laminar flow of an inert or other non-dissociating gas can be directed in front of the window. This effectively provides an insulating gas layer and prevents the photodissociating molecules from making contact with the front window. Fourth, a sufficiently fast (that is, sharp) focusing of the optical beam from the laser element can be employed so that there is a large ratio of light intensity between the front window surface and the surface of the substrate. This allows a much faster deposition rate on the substrate surface than on the window and consequently, while not preventing deposition on the front window, this technique does reduce the amount of the deposition in relation to the thickness of the coating on the substrate surface and provides for front window deposition at a "tolerable" level.

With either a continuous or a pulsed source, the spatial resolution of the deposited layer, using, for example, the apparatus of FIG. 1, appears to be improved by the presence, as noted above, of helium gas, acting as a buffer. The role of helium as a buffer gas appears to be at least two-fold. First, it reduces the diffusion to the substrate surface of decomposed metal atoms formed outside the region of best focus and second, the helium acts as a center for 3-body recombination of the resulting molecular fragments, again reducing the flux of atoms from outside the region of best laser focus.

Up until now, it has been impliedly assumed that the relative positions of the laser and the substrate are fixed. This however need not be so. Thus, either the laser 10, the optical system 12, or the cell or chamber 14 can be moved to effect relative movement of the focused laser beam relative to the substrate surface 27. In the illustrated embodiment of FIG. 1, a scanning system has a scanning assembly 28 secured to laser 10 for moving laser 10 in a direction normal to the optical axis of optical system 12. As the laser is moved, the focused position of the laser beam adjacent to the surface 27 of substrate 16 translates and the focused position is therefore scanned across the surface of substrate 16, for example, according to a predetermined pattern. In this manner, a line deposit, for example, can be formed or written on the surface of the substrate. In actual practice, line widths as small as 1 micron have been obtained. The high brightness of the laser source allows the small line widths to be written at practical rates.

The embodiment illustrated in FIG. 1 can be employed for many different applications, and the particular application dictates the gaseous mixture which is introduced into chamber 14 by gas supply means 19. Thus, such applications as, for example, forming ohmic contacts on a substrate and in particular a semiconductor substrate; effecting repair of a surface discontinuity in the surface layer of a body such as for example a broken metal lead line or a break in the metallization or pattern of a photolithographic mask; producing a pn junction on a doped semiconductor substrate; and laying down a compound layer such as gallium arsenide on a semiconductor layer are only a few illustrations of the many applications of the invention. In each of these applications it is important to note that the elements or materials being deposited on the substrate surface are "surface-compatible"; that is, the surface-compatible materials do not erode a portion of the substrate surface as is typical in for example etching, but instead, for example, form a surface-compatible deposit on top of the substrate surface. Alternatively a surface-compatible material can diffuse or otherwise combine with the structure of the existing layer to form a new surface layer having improved properties.

For many applications, it is important that the product of photodeposition be adherent to the substrate surface. Two factors which can affect adherence of the film to the substrate surface are proper substrate surface cleaning, including bakeout, prior to photodeposition and the amount of laser power employed to effect photodeposition. Other variables such as surface temperature, surface roughness and morphology, and additive gases, can also advantageously influence film adherence to the substrate surface.

In particular, a one-step cleaning with methanol or acetone advantageously removes surface oils from the substrate surface and thereby promotes better adhesion of a deposited film to the surface. Furthermore, during deposition, it is necessary to remove atmospheric gas contamination, for example water vapor, by desiccation or evacuation of the chamber.

As noted above, the laser intensity also affects adherence of the film to the substrate. In particular, if the deposit is too rapid, gas phase nucleation of the deposit, for example in metal deposits, can result. Thus, too rapid a deposit can cause the deposit to form granules prior to deposition. A preferred range of laser intensity for trimethyl aluminum is, for example, less than 100 watts per centimeter at one Torr pressure. This provides good adhesion of the deposit of aluminum to the substrate. For trimethyl cadmium however, a laser intensity of less than 10 watts per square centimeter results in good deposits.

The crystalline or structural properties of the deposited film have been found to be a function of the deposition rate, and therefore the gas pressure, laser intensity, substrate surface morphology or any surface relief structures, and the actual substrate material all affect the deposit crystalline and structural properties. For example, too rapid a deposition can, as noted above, cause gas phase nucleation which results in a "rough" crystalization, that is, a granular film. In a particular preferred embodiment, a laser intensity of 1–2 watts per square centimeter with dimethyl cadmium at one Torr pressure (a 257 nanometer continuous wave laser) can result in a grain size of 75 angstroms. This provides a mechanically tough adherent layer.

Experimental evidence also demonstrates that the introduction of $O_2$, for example at a pressure of 1–200 Torr, advantageously provides a "scavenger" effect whereby free dissociation products, which are not of the kind which deposit or condense on the substrate surface, react with the "scavenger" gas and are effectively removed from the area of the deposit. Thus, the addition of a chemically active gas can reduce the quantity of residual impurity atoms in the deposition. For example, the addition of a small quantity of gaseous oxygen will "scavenge" the organic radical and prevent incorporation of it or any of its constituent atoms in the deposit. The "scavenger" gas can provide an increased continuous deposition rate by preventing recombination of the original dissociation fragments. In a particular embodiment, the scavenging effect is achieved by oxygen at 1 Torr when used with 2 Torr tetraethyl tin. The oxygen gas "scavenges" the ethyl radical which results from photodissociation of the tetraethyl tin molecule.

As another consideration, helium, for example, at 1 Atmosphere, acts as a buffer gas, as noted above, to improve the resolution or localization of the deposite and thus to eliminate "haloing" in the deposition. The addition of a gas which scavenges the depositing atom in the gas phase also can localize the deposition process; however, it then also acts to reduce the deposition rate. Also, a small amount of substrate heating can advantageously affect the electrical and mechanical properties of the deposited layer through annealing or vaporization of low boiling point impurities. However, excess heating can cause reevaporation of the deposit, resulting in structural damage.

The apparatus of FIG. 1 can also be employed for photodepositing semiconductor materials. For example, germanium can be deposited from a tetramethyl germanium vapor (at 100 Torr) using a weakly focused 193 nm light from an ArF laser which provides approximately three millijoules per square centimeter per 50 nanosecond pulse.

The following examples illustrate a few of the many applications of the present invention. These examples are not meant to be taken in a limiting sense and are for illustrative purposes only, illustrating the great potential of the invention.

EXAMPLE 1

Employing the apparatus illustrated in FIG. 1, and using trimethyl aluminum or dimethyl cadmium as the decomposable gaseous component, aluminum or cadmium respectively was deposited from the gaseous phase. The deposition rates have been measured as a function of incident energy flux and gas pressure for both cadmium and aluminum. At a flux of 0.1 watts per square centimeter, the deposition rate was linear over the range 0.5-3 Torr (for dimethyl cadmium) and 1-8 Torr (for trimethyl aluminum). Deposition rates were found to be linear as a function of flux up to 2 watts per square centimeter for cadmium and up to 500 watts per square centimeter for aluminum. Deposition rates for cadmium greater than 300 Angstroms per second have been obtained using a few milliwatts of 257 nm laser power.

EXAMPLE 2

The apparatus of FIG. 1 has been successfully employed to selectively dope regions of a substrate and in particular for example, to produce ohmic contacts on a p-type, zinc doped, InP semiconductor substrate. Such contacts are especially useful in the fabrication of GaInAsP/InP diode lasers. A pulsed ArF excimer laser was employed to produce cadmium or zinc deposits by the photolysis of dimethyl cadmium to dimethyl zinc respectively. The output of the ArF laser, a 7 nanosecond wide pulse, was used to illuminate a 100-500 micron pinhole, which was then imaged by 2:1 reducing optics onto an InP substrate mounted in a 1 centimeter long stainless steel chamber 14. The same laser thereafter locally heats a shallow surface layer of the substrate to near its melting point thereby producing a highly doped surface layer.

The substrate is a InP:Zn sample ($N_A = 10^{18}$cm$^{-3}$), (100) surface, polished using a bromine:methanol solution. Ohmic contacts were obtained under a variety of conditions. The best contacts obtained had a resistance area product of $1.9 \times 10^{-4}$ ohm-cm$^2$. The results using either zinc or cadmium depositions were essentially identical. However, the pressure dependence of the contact resistance showed that ohmic contacts were not obtained for dimethyl cadmium pressures of 0.5 Torr or less, while at pressures greater than 5 Torr, excessive gas absorption interferes with the formation of the contacts. The usable range of energy fluences (typically between one and three Joules per square centimeter) is limited by the occurrence of surface damage at the high energy end and by increasing contact resistance at low energy.

Contacts as small as 35 microns in diameter have been obtained.

EXAMPLE 3

Another example of the selective doping of a semiconductor substrate is the production of an pn junction on a silicon substrate using a pulsed laser. Again referring to FIG. 1, trimethyl aluminum at between one and five Torr, and preferably 3 Torr, was introduced into the chamber 14 having therein an n-type substrate body (1-5 ohm - centimeters) supported in the path of the incoming focused laser beam. A layer of aluminum was deposited on a substrate surface under these conditions. The incident energy source was an ArF laser having a pulse output as in Example 2 and with an energy fluence of approximately 1 joule per square centimeter. The energy fluence can be varied between 0.5 and 3 joules per square centimeter in this example. The laser was simultaneously focused onto the surface of the aluminum, and the resulting localized surface heating causes the aluminum layer to diffuse into the substrate surface to form a p-type region therein. The resulting pn junction can function as a photovoltaic solar cell, producing open circuit voltages of 0.5 volts or more.

A p-type region of a desired pattern can be formed in this manner by scanning the laser relative to the substrate body to translate the focused position across the surface. In this manner, and by pulsing the laser appropriately, a plurality of pn junctions can be formed.

EXAMPLE 4

Figure 3:
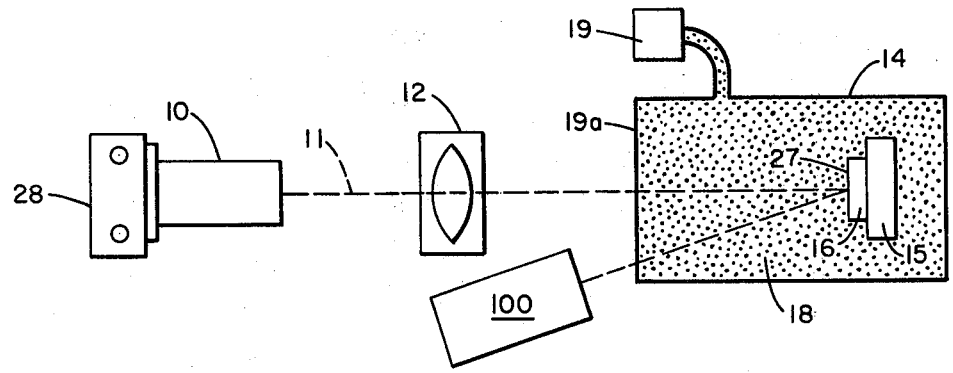
FIG. 3 is a schematic representation of a third embodiment according to the invention.

In an alternate embodiment of the invention, referring now to FIG. 3, the process parameters of Examples 2 and 3 remain the same except that a separate source 100 of laser energy is provided to effect localized heating of the substrate surface. For example, a linear or stripe shaped ohmic contact (of cadmium) was produced on p- and n-type InP by using a 257 nm beam (21 milliwatts of energy) from a frequency doubled Ar+ laser to effect the deposition of cadmium, and a 514.7 nm beam (about 3 watts) from an Ar+ laser to locally heat the sample. Resistances as low as $2 \times 10^{-4}$ ohm-cm were obtained using 2 Torr of dimethyl cadmium parent gas.

In addition to depositing a single solid material upon the surface of a substrate, two (or more) materials can be simultaneously deposited to form for example a compound semiconductor, an insulator, or a conductor. Thus, for example, a two component gas mixture can be used to deposit a compound, and chamber 14 (FIG. 1)

can be filled with carrier gases which, upon photodissociation through the absorption of energy from an incident laser beam, can produce for example gallium arsenide (from trimethyl gallium and trimethyl arsenic); zinc selenide (from dimethyl zinc and hydrogen selenide); or zinc sulfide (from dimethyl zinc and hydrogen sulfide) on the surface of the semiconductor.

Similarly, the deposition of the insulator silicon nitride can be obtained by irradiating a mixture of silicon tetrahydride ($SiH_4$) (at 740 Torr) and ammonia (at 10 Torr) with weakly focused 193 mn light from the argon fluoride laser noted above. The energy from the argon fluoride laser (50 nanosecond pulses at a fluence of 3 millijoules per square centimeter) causes dissocation of the ammonia gas. This dissocation then initiates a surface or gas-phase reaction with the gaseous silane to form silicon nitride.

Laser photodeposition allows the direct generation of metal patterns without the intermediate photolithographic steps required in conventional microelectronic fabrication. This could for example be accomplished by imaging the laser beam in a desired pattern, for example a spatially disjoint pattern adjacent to the surface of the semiconductor. (By spatially disjoint we mean a non-continuous illumination pattern adjacent the substrate surface.) For this purpose, a desired image can be placed in the path of the laser beam for example as indicated by dotted line 36 in FIG. 1. Also, and importantly, direct writing of a pattern at practical rates and resolution can be employed.

The invention has been described in terms of direct optical imaging and focusing of the laser source adjacent a substrate surface. In addition, a system has been described for imaging a pattern onto a substrate surface. In other applications of the invention, holographic and/or coherent interferometry pattern forming apparatus can replace the pattern forming assembly 12, 36 of FIG. 1 to image a (spatially disjoint) pattern onto a substrate surface "indirectly" using these well-known optical techniques. This allows, for example, for the generation of grating and other interferometric patterns on the substrate surface in an easy and reliable manner.

Additions, subtractions, deletions, and other modifications of the illustrated embodiments will be obvious to those skilled in the art and are within the scope of the following claims.

What is claimed is:

1. Apparatus for depositing from a fluid phase, a layer of a surface compatible material onto a selected surface of a substrate body comprising
    a deposition chamber,
    means for supporting said body in said chamber,
    a laser source of energy operating at a wavelength shorter than 700 nm,
    an optical system for focusing said energy toward said selected surface at a position adjacent said selected surface, said optical system further directing said energy onto said selected surface, and
    means for introducing a fluid medium into said chamber adjacent to the said surface, at least one component of said fluid medium being absorptive at said desired frequency for effecting photodecomposition of said at least one component of the medium in said fluid phase at a photodissocation rate which is linear with power, for depositing said surface-compatible material product of said photodecomposition onto said body surface in a selected pattern.

2. Apparatus for depositing from the gaseous phase a layer of a surface-compatible material onto a selected surface of a body comprising
    a deposition chamber,
    means for supporting said body in said chamber,
    a laser source of energy operating at a wavelength shorter than 700 nm,
    an optical system for focusing said energy toward said selected surface at a position adjacent said selected surface, said optical system further directing said energy onto said selected surface, and
    means for introducing a gaseous medium into said chamber adjacent said surface, at least one component of said gaseous medium absorbing energy at said frequency for effecting photodecomposition of said at least one component of said medium in said gas phase at a photodissocation rate which is linear with power, for depositing said surface-compatible material product of said photodecomposition onto said surface in a selected pattern.

3. The apparatus of claim 2 further comprising
    means for scanning said focused laser energy across said surface for depositing said layer according to a predetermined pattern.

4. The apparatus of claim 3 wherein said laser is a continuous wave ion laser.

5. The apparatus of claim 4 wherein said laser is a frequency doubled argon-ion laser operating at substantially 257 nm.

6. The apparatus of claim 3 wherein said laser is an excimer laser.

7. The apparatus of claim 6 wherein said laser is an ArF excimer pulsed laser operating at substantially 193 nm.

8. The apparatus of claim 2 further comprising means for establishing a buffer gas component in said chamber, for improving localization of said deposit.

9. The apparatus of claim 2 further comprising means for establishing a scavenger gas component in said chamber for aiding in the removal of selected undesired products of said gaseous photodecomposition in the region of said deposition.

10. The apparatus of claim 2 further comprising
    means for measuring the thickness of the layer of said surface-compatible material on said selected surface during the deposition of said material.

11. The apparatus of claim 10 wherein said measuring means comprises
    a photosensitive element responsive to said laser energy,
    means for positioning said photoelectric sensing element in the path of energy passing through and exiting from said body, and
    visual display means for displaying a record representing the thickness of the deposit on said body.

12. The apparatus of claim 2 further comprising
    optical viewing means for optically viewing the deposition of said surface compatible material onto said selected surface.

13. Apparatus for forming a selectively doped region by depositing a selected material from the gaseous phase onto a surface of a semiconductor substrate body comprising
    a deposition chamber,
    means for supporting said body in said chamber,
    a laser source of energy operating at a wavelength shorter than 700 nm, an optical system for focusing said energy toward said selected surface at a position adjacent to said selected substrate surface, said optical system further directing said energy onto said selected surface, means for introducing a gaseous medium into said chamber adjacent said surface, at least one component of said gaseous medium absorbing said laser energy at said frequency for effecting photodecomposition of said at least one component of said medium in the gas phase at a photodissocation rate which is linear with power, for depositing said selected material upon said surface in a selected pattern, and means for locally heating said substrate surface for producing said selectively doped surface region.

14. The apparatus of claim 13 further comprising means for establishing a buffer gas component in said chamber for improving localization of said deposit.

15. The apparatus of claim 13 further comprising means for establishing a scavenger gas component in said chamber for aiding in the removal of selected undesired products of said gaseous photodecomposition in the region of said deposition.

16. The apparatus of claim 13 further comprising means for scanning said focused laser energy across said surface for depositing said layer according to a predetermined pattern.

17. The apparatus according to claim 13 wherein said heating means includes a laser source for locally heating said substrate surface.

18. The apparatus of claim 13 wherein said laser source is the means for locally heating said substrate.

19. The apparatus of claim 13 wherein said locally heating means comprises a second laser source and means for optically positioning the energy output from said second laser source for locally heating said surface.

20. The apparatus of claim 13 further comprising means for establishing a scavenger gas component in said chamber for aiding in localization of the spatial extent of said region of deposition.

21. Apparatus for repairing a surface discontinuity in a surface layer of a body by depositing a selected material from the gaseous phase onto said body surface layer at said discontinuity comprising a deposition chamber, means for supporting said body in said chamber, a laser source of energy operating a wavelength shorter than 700 nm, an optical system for focusing said energy toward said surface layer at a position adjacent to the surface discontinuity in said surface layer, said optical system further directing said energy onto said selected surface, and means for introducing a gaseous medium into said chamber adjacent said surface, at least one component of said gaseous medium absorbing said laser energy at said frequency for effecting photodecomposition of said at least one component of said medium for depositing, from the gas phase at a photodissociation rate which is linear with power, said material upon said surface at said surface discontinuity in a selected pattern, whereby said surface discontinuity can be repaired.

22. The apparatus of claim 21 further comprising means for establishing a buffer gas component in said chamber for improving localization of said deposit.

23. The apparatus of claim 21 further comprising means for establishing a scavenger gas component in said chamber for aiding in the removal of selected undesired products of said gaseous photodecomposition in the region of said deposition.

24. The apparatus of claim 21 further comprising means for measuring the thickness of the layer of said surface compatible material on said selected surface during the deposition of said material.

25. The apparatus of claim 21 further comprising optical viewing means for optically viewing the deposition of said surface compatible material onto said selected surface.

26. The apparatus of claim 21 further comprising means for scanning said focused energy across said surface for depositing said layer according to a predetermined pattern.

27. Apparatus for producing a pn junction in a surface layer of a doped semiconductor substrate comprising a deposition chamber, means for supporting said substrate in said chamber, a laser source of energy operating at a wavelength shorter than 700 nm, an optical system for focusing said energy towards said selected surface at a position adjacent to said surface layer at a substrate surface portion thereof, said optical system further directing said energy onto said selected surface, means for introducing a gaseous medium into said chamber adjacent said surface portion, at least one component of said gaseous medium absorbing said laser energy at said frequency for effecting photodecomposition of said at least one component of said medium from the gaseous phase at a photodissociation rate which is linear with power, for depositing a pn junction producing material upon said surface in a selected pattern, and means for locally heating said substrate surface for aiding diffusion of said deposited material into said substrate at said surface.

28. The apparatus of claim 27 further comprising means for establishing a buffer gas component in said chamber for improving localization of said deposit.

29. The apparatus of claim 27 further comprising means for establishing a scavenger gas component in said chamber for aiding in the removal of selected undesired products of said gaseous photodecomposition in the region of said deposition.

30. The apparatus of claim 27 further comprising means for establishing a scavenger gas component in said chamber for aiding in localization of the spatial extent of said region of deposition.

31. The apparatus of claim 27 further comprising means for scanning said focused laser energy across said surface for depositing said layer according to a predetermined pattern.

32. The apparatus according to claim 27 wherein said heating means includes a laser source for locally heating said substrate surface.

33. Apparatus for depositing from the gaseous phase a layer of a material onto a selected surface of a body in a predetermined spatially disjoint pattern comprising a deposition chamber, means for supporting said body in said chamber, a laser source of energy operating at a wavelength shorter than 700 nm, an optical system for focusing said energy toward said selected surface at a position adjacent said selected surface, said optical system having means for focusing a spatially defined pattern of energy toward said selected surface at said position, said optical system further directing said energy onto said selected surface, and means for introducing a gaseous medium into said chamber adjacent said surface, at least one component of said gaseous medium absorbing energy at said frequency for effecting photodecomposition of said at least one component of said medium in said gas phase at a photodissociation rate which is linear with power, for depositing said material product of said photodecomposition onto said surface according to said pattern.

34. The apparatus of claim 33 wherein said optical system comprises means for focusing an interference pattern onto said substrate.

35. Apparatus for depositing, from a gaseous phase, a layer of a compound onto a selected surface of a body comprising
a deposition chamber,
means for supporting said body in said chamber,
a laser source of energy operating at a wavelength shorter than 700 nm,
an optical system for focusing said energy toward said selected surface at a position adjacent said selected surface, said optical system further directing said energy onto said selected surface, and
means for introducing into said chamber and adjacent said surface a gaseous medium, said gaseous medium having a first component for absorbing energy at said frequency for effecting photodecomposition of said first component in the gaseous phase at a photodissociation rate which is linear with power, and a second component for reacting in the gaseous phase with a product of said photodecomposition for depositing on said surface a compound comprising two gaseous phase reactants.

36. The apparatus of claim 35 wherein said gaseous medium second component is selected for absorbing energy at said frequency for effecting photodecomposition of said second component in the gas phase and whereby the products of decomposition of said first and second components react in the gas phase for depositing said compound onto said surface.

37. A method for selectively depositing a surface-compatible film on a surface of a substrate body comprising the steps of
supporting said substrate body in an enclosed chamber,
exposing at least said substrate surface of said body in said chamber to a gaseous environment containing at least one photolytically decomposable compound,
directing a laser source of energy onto said surface,
focusing said laser source of energy at a position adjacent to said surface, said source having an energy output at a wavelength to effect photolytic decomposition of said one photolytically decomposable compound in the gaseous phase at a photodissociation rate which is linear with power, and
photolytically decomposing said one compound to effect deposition of said surface-compatible film onto said surface in a selected pattern.

38. The method of claim 37 further wherein said photolytically decomposable compound is a molecular vapor.

39. A method for selectively depositing a surface-compatible film on a surface of a substrate body comprising the steps of
supporting said substrate body in an enclosed chamber,
exposing at least said substrate surface of said body in said chamber to a gaseous environment containing at least one photolytically decomposable compound,
focusing a laser source of energy at a position adjacent to said surface, said source having an energy output at a wavelength to effect photolytic decomposition of said one photolytically decomposable compound in the gaseous phase,
photolytically decomposing said one compound to effect deposition of said surface-compatible film onto said surface, and
introducing a scavenger gas component into said chamber for aiding in the removal of selected undesired products of said gaseous decomposition.

40. A method for selectively depositing a surface-compatible film on a surface of a substrate body comprising the steps of
supporting said substrate body in an enclosed chamber,
exposing at least said substrate surface of said body in said chamber to a gaseous environment containing at least one photolytically decomposable compound,
focusing a laser source of energy at a position adjacent to said surface, said source having an energy output at a wavelength to effect photolytic decomposition of said one photolytically decomposable compound in the gaseous phase,
photolytically decomposing said one compound to effect deposition of said surface-compatible film onto said surface, and
introducing a buffer gas component into said chamber for aiding localization of the deposition of the decomposed composition on said surface.

41. The method of claim 37 wherein said gaseous environment has at least one component selected from the group of organo-metallic, metal carbonyl, metal halide and germanium compounds.

42. A method for selectively depositing a surface-compatible film on a surface of a substrate body comprising the steps of
supporting said substrate body in an enclosed chamber,
exposing at least said substrate surface of said body in said chamber to a gaseous environment containing at least one photolytically decomposable compound,
directing a laser source of energy onto said surface,
focusing said laser source of energy at a position adjacent to said surface, said source having an energy output at a wavelength to effect photolytic decomposition of said photolytically decomposable compound in the gaseous phase at a photodissociation rate which is linear with power,
photolytically decomposing said compound to effect deposition of said surface-compatible film layer onto said surface, and
scanning said focused energy along a path parallel to said surface for effecting the deposition of the film layer on said surface in a desired pattern.

43. A method for forming a selectively doped region by depositing a selected material from a gaseous phase onto a surface of a substrate body comprising the steps of
- supporting said substrate surface in an enclosed chamber,
- exposing at least said substrate surface of said body in said chamber to a gaseous environment containing at least a photolytically decomposable compound,
- directing a laser source of energy onto said surface,
- focusing said laser source of energy at a position adjacent to said surface, said source having an energy output at a wavelength which effects photolytic decomposition of said photolytically decomposable compound at a photodissociation rate which is linear with power,
- photolytically decomposing said compound to form said selected material as a product thereof in a selected pattern, and
- locally heating said substrate surface for producing said selectively doped region in said substrate surface.

44. A method for repairing a surface discontinuity on a surface of a body by depositing a selected material from the gaseous phase onto the body surface at said discontinuity in a selected pattern comprising the steps of
- supporting the body in an enclosed chamber,
- exposing at least the surface layer of said body in said chamber to a gaseous environment containing at least a photolytically decomposable compound selected to produce as a product of decomposition said selected material,
- directing a laser source of energy onto said surface,
- focusing said laser source of energy at a position adjacent to said surface, said source having an energy output at a wavelength selected to produce photolytic decomposition of said photolytically decomposable compound at a photodissociation rate which is linear with power,
- photolytically decomposing said compound for repairing said surface discontinuity.

45. The method of claim 44 further comprising the steps of
- scanning said focused laser energy across said surface for repairing a surface discontinuity having an extent greater than the extent of the focused laser energy, and
- providing a visual feedback of said deposition process.

46. A method for producing a pn junction in a surface layer of a doped semiconductor substrate comprising the steps of
- supporting said doped semiconductor substrate in an enclosed chamber for exposing said surface layer,
- exposing at least the surface layer of said substrate in said chamber to a gaseous environment containing at least a photolytically decomposable compound having as a product of decomposition a pn junction forming component,
- directing a laser source of energy onto said surface,
- focusing said laser source of energy at a position adjacent to said surface, said source having an energy output at a wavelength which effects photolytic decomposition of said photolytically decomposable compound at a photodissociation rate which is linear with power,
- photolytically decomposing said compound to form and deposit said junction forming material in a selected pattern, and
- locally heating said substrate surface at said deposition for diffusing said deposited material into said substrate at said surface for forming said pn junction.

47. A method for selectively depositing a surface-compatible film in a selected spatially disjoint pattern on a substrate surface comprising the steps of
- supporting said substrate body in an enclosed chamber,
- exposing at least said substrate surface of said body in said chamber to a gaseous environment containing at least one photolytically decomposable compound,
- providing a laser source of energy directed toward said chamber through an optical system,
- directing a laser source of energy onto said surface,
- generating said selected pattern of energy from said laser source at a position adjacent to said surface,
- wherein said source has an energy output at a frequency to effect photolytic decomposition of said one photolytically decomposable compound at a photodissociation rate which is linear with power, and
- photolytically decomposing said compound to effect formation of said surface-compatible film in said selected pattern.

48. The method of claim 47 wherein said pattern corresponds to an interference pattern.

49. The method of claim 47 wherein said pattern corresponds to a holographically generated pattern.

50. A method for selectively depositing a film on a surface of a substrate body, said film being composed of two components, comprising the steps of
- supporting the substrate body in an enclosed chamber,
- exposing at least said substrate surface of said body in said chamber to a gaseous environment containing at least one photolytically decomposable compound, and
- directing a laser source of energy onto said surface,
- focusing said laser source of energy at a position adjacent to said surface, said source having an energy output at a wavelength to effect photolytic decomposition of said one photolytically decomposable compound at a photodissociation rate which is linear with power,
- photolytically decomposing said one compound to effect formation of a reactive material therefrom, and
- providing a second material with which said reactive material is compatible for forming said compound layer.

51. The method of claim 50 wherein said providing step comprises
- providing a second gas to said gaseous environment containing a second photolytically decomposable compound, a product of said second photolytic decomposition being reactive with the product of said first photolytic decomposition in the gaseous phase for forming said film layer.

52. The method of claim 50 wherein said providing step comprises
- providing a substrate surface having a material thereon which reacts with a product of said first photolytic decomposition for forming on said surface a surface-compatible film layer.

53. A method for selectively depositing a surface-compatible film on a surface of a substrate body comprising the steps of supporting said substrate body in an enclosed chamber, exposing at least said substrate surface of said body in said chamber to a fluid environment containing at least one photolytically decomposable compound, directing a laser source of energy onto said surface, focusing said laser source of energy at a position adjacent to said surface, said source having an energy output at a wavelength to effect photolytic decomposition of said one photolytically decomposable compound in the fluid phase at a photodissociation rate which is linear with power, and photolytically decomposing said one compound for effecting decomposition of said surface-compatible film layer in a selected pattern.

* * * * *